United States Patent [19]

Butler et al.

[11] 4,144,527

[45] Mar. 13, 1979

[54] DUAL-SLOPE ANALOG TO DIGITAL CONVERTER

[75] Inventors: Walter J. Butler; Charles M. Puckette, both of Scotia, N.Y.

[73] Assignee: General Electric Company, Schenectady, N.Y.

[21] Appl. No.: 825,530

[22] Filed: Aug. 18, 1977

[51] Int. Cl.² ........................................... H03K 13/20
[52] U.S. Cl. ....................... 340/347 AD; 340/347 NT
[58] Field of Search ..... 340/347 M, 347 NT, 347 AD

[56] References Cited

U.S. PATENT DOCUMENTS

| | | | |
|---|---|---|---|
| 2,801,281 | 7/1957 | Oliver | 340/347 M |
| 3,414,807 | 12/1968 | Evans | 340/347 NT |
| 3,439,272 | 4/1969 | Bailey | 340/347 NT |
| 3,525,093 | 8/1970 | Marshall | 340/347 NT |
| 3,688,305 | 8/1972 | Goldsworthy | 340/347 M |

*Primary Examiner*—Charles D. Miller
*Attorney, Agent, or Firm*—Geoffrey H. Krauss; Joseph T. Cohen; Marvin Snyder

[57] ABSTRACT

A time-independent, dual-slope analog to digital converter is disclosed. During a first integration period, a predetermined number of charge packets having a first polarity and a magnitude proportional to the magnitude of an analog voltage to be converted are applied to a charge storage element. The first integration period is followed by a second integration period during which a second plurality of charge packets are applied to the charge storage element. The second plurality of charge packets each have a polarity opposite to that of the first plurality of charge packets and a predetermined, constant magnitude. The number of second charge packets required to return the charge stored in the charge storage element to its original value is indicative of the magnitude of the analog signals to be converted.

16 Claims, 4 Drawing Figures

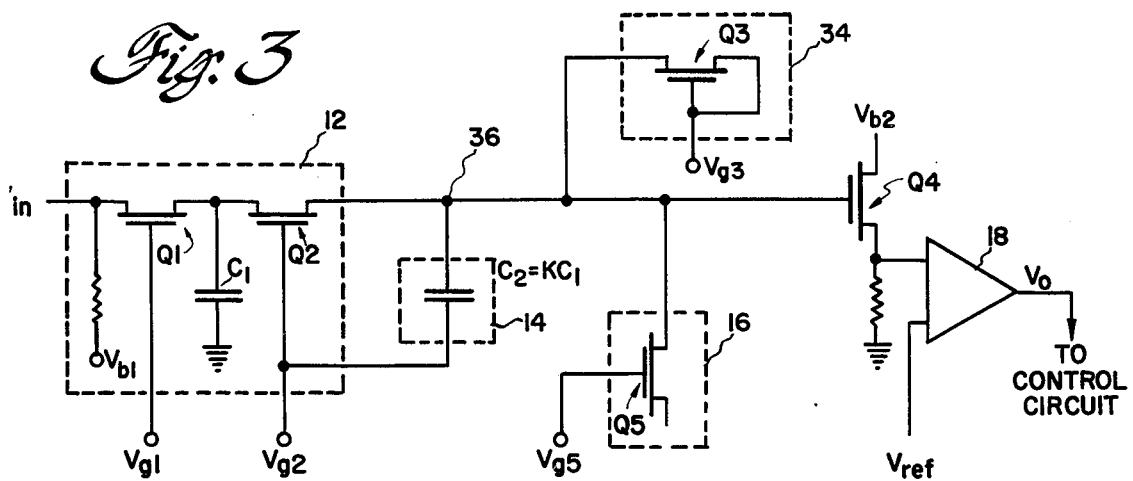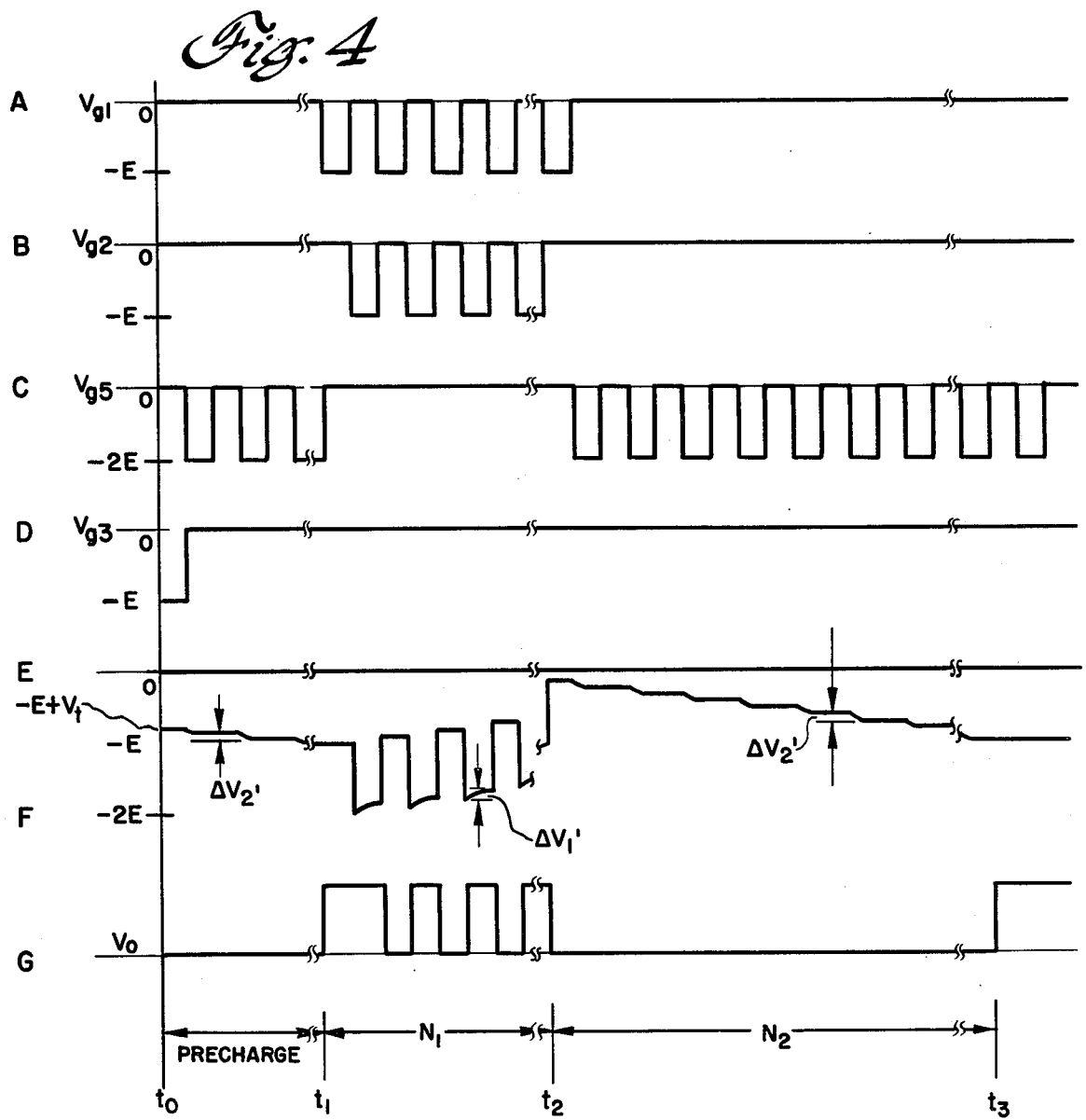

DUAL-SLOPE ANALOG TO DIGITAL CONVERTER

BACKGROUND OF THE INVENTION

The present invention relates to a dual-slope analog to digital converter, and more particularly, to a dual-slope analog to digital converter which is time independent.

Prior art dual-slope analog to digital converters are based upon the principle that the slope of a linear integrating element is proportional to the magnitude of the signal being integrated. In a typical integrator of this type, an unknown analog voltage is applied to a linear integrator (such as an operational amplifier with a capacitor in its feed back circuit) and integrated for a predetermined time period. At the end of this first integration period, the output of the integrator will have increased at a constant slope from a first to a second value. At the completion of the first integration period, a signal of a known value and opposite polarity to the first, unknown, signal is applied to the integrator causing a negative slope integration of the known signal. A digital measurement is then taken of the time required for the output of the integrator to decrease from the second to the first value (the value at the initiation of the conversion process). This measurement is normally taken by applying a pulse train having a predetermined frequency to a digital counter for the duration of the second integration period. The count in the counter at the end of this period is indicative of the magnitude of the analog signal to be converted. Analog to digital converters of the foregoing type are exemplified by U.S. Pat. No. 3,826,983.

The primary drawback of the prior art converters is that they are time dependent. Accordingly, any fluctuations in the frequency of the pulse train applied to the counter or in the length of the first predetermined integration period will result in an incorrect measurement.

BRIEF DESCRIPTION OF THE INVENTION

The foregoing and other problems of the prior art are overcome in the present invention by utilizing a charge storage process which effectuates the integration operations of the prior art analog to digital converters without the necessity of utilizing linear integrating elements. More particularly, the present invention utilizes a bucket brigade circuit in combination with a storage capacitor to effectuate the first integrating process and a charge pump in combination with the storage capacitor to effectuate the second integration process. During the first integration portion of a conversion cycle, the bucket brigade circuit delivers a predetermined number of discrete packets of charge to the charge storage capacitor increasing the voltage across the capacitor from a first to a second value. Each packet of charge has a magnitude proportional to the magnitude of the analog signal to be converted. During the second integration portion of the conversion cycle, the charge pump removes a succession of packets of charge to the storage capacitor until the voltage across the capacitor decreases from the second to the first value. Each packet of charge removed by the charge pump is of a constant value. A counter counts the number of packets of charge required to return the voltage across the charge storage capacitor from the second to the first value. Since the number of charge packets delivered to the capacitor during the first integration portion and the magnitude of the charge packets delivered to the capacitor during the second integration portion are constant and the magnitude of the charge pockets delivered during the first integration portion is proportional to the magnitude of the analog signal to be converted, the count in the counter provides digital indication of the magnitude of the analog signal to be converted.

BRIEF DESCRIPTION OF THE DRAWINGS

For the purpose of illustrating the invention, there is shown in the drawings several embodiments which are presently preferred; it being understood, however, that this invention is not limited to the precise arrangements and instrumentalities shown.

FIG. 3 is a circuit diagram of an analog to digital converter constructed in accordance with the principles of the present invention.

FIG. 4 is a series of wave forms illustrating the voltages at various points in the circuit of FIG. 3.

DETAILED DESCRIPTION OF THE INVENTION

Figure 1:
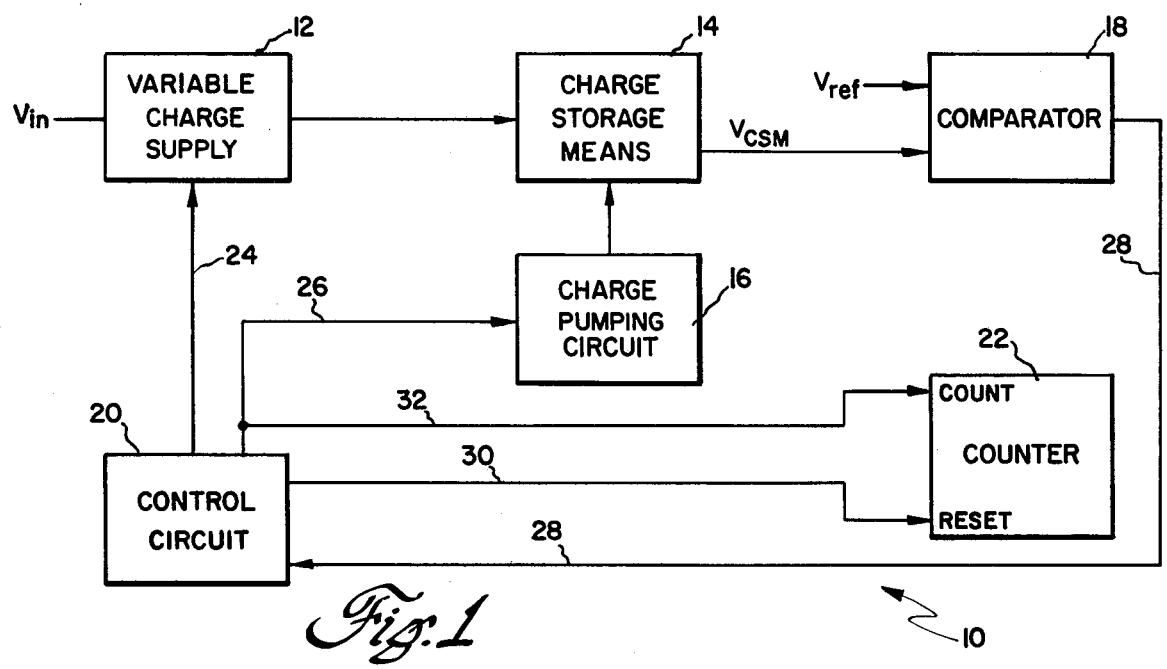
FIG. 1 is a block diagram of an analog to digital converter constructed in accordance with the present invention.

Referring now to the drawings, wherein like numerals indicate like elements, there is shown in FIG. 1 a block diagram of an analog to digital converter constructed in accordance with the principles of the present invention and designated generally as 10.

Analog to digital converter 10 includes a variable charge supply circuit 12 which supplies a plurality of packets of charge to charge storage means 14 during each analog to digital conversion process. The number of charge packets supplied by variable charge supply means 12 is controlled by a control circuit 20 whose operation is described in some detail below. Briefly, control circuit 20 generates a predetermined number of gating pulses on line 24 during a first "integration" portion of the analog to digital conversion process. Each time control circuit 20 generates another gating pulse on line 24, variable charge supply circuit 12 applies another discrete packet of charge to charge storage means 14. Each packet of charge supplied by variable charge supply 12 has a magnitude proportional to the magnitude of an analog input signal $V_{in}$ to be converted by circuit 10. The polarity of the charge supplied by variable charge supply circuit 12 may be either positive or negative depending upon the type of charge supply utilized. For purposes of explanation, it will be assumed that variable charge supply 12 supplies a positive packet of charge to charge storage means 14.

Analog to digital converter 10 further includes a charge pumping circuit 16 which acts to remove a plurality of packets of charge to discharge storage means 14 during each analog to digital conversion process. The number of charge packets removed by charge pumping circuit 16 is controlled by control circuit 20 in cooperation with comparator 18. Particularly, control circuit 20 generates a plurality of gating pulses on line 26 during a second "integration" period of the analog to digital conversion process. Each time control circuit 20 generates another gating pulse on line 26, charge pumping circuit 16 removes another discrete packet of charge from charge storage means 14. The magnitude of the charge packets removed by circuit 16 must be essentially constant. Control circuit 20 ceases to generate gating pulses on line 26 whenever comparator 18 detects that the amount of charge removed from charge storage means 14 by charge pumping circuit 16 is equal to the charge supplied to charge storage means 14 by variable charge supply circuit 12.

Comparator 18 is a standard digital comparator which generates an output signal on line 28 whenever the voltage $V_{csm}$ across charge storage means 14 reaches a preset reference value $V_{ref}$. For simplicity of explanation, it will be assumed in the following discussion that the reference value $V_{ref}$ is zero volts d.c. However, any desirable reference voltage may be employed.

Figure 2:
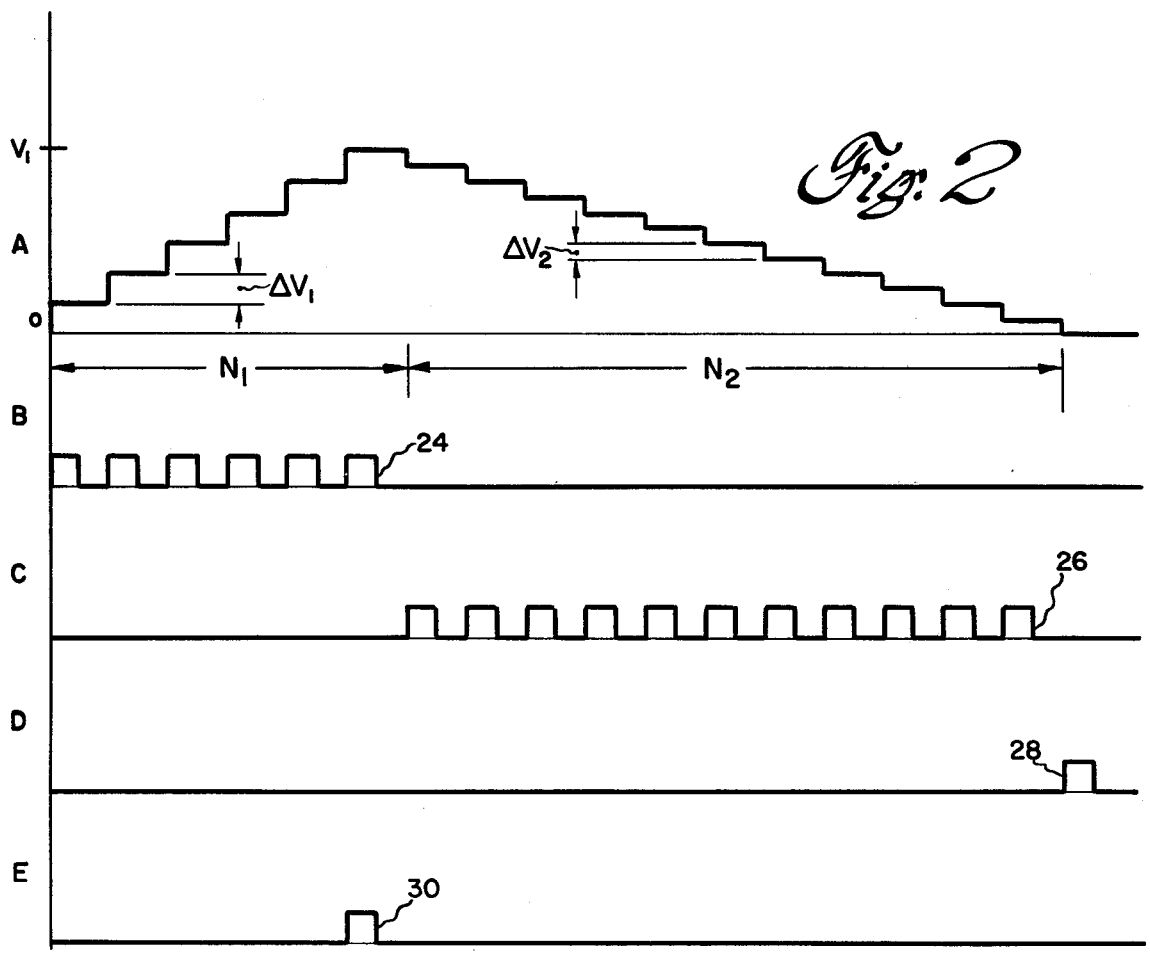
FIG. 2 is a series of wave forms indicating the voltages at various points in the analog to digital converter of FIG. 1.

Control circuit 20 is preferably a simple digital circuit which will supply the gating signals illustrated in FIG. 2 to control the operation of analog to digital converter 10. Such control circuits are well within the skill of the art and need not be disclosed in detail. Finally, counter 22 is a standard digital counter which is reset each time a gating signal is applied to line 30 and which steps up one count each time a gating signal is applied to line 32.

The operation of the analog to digital converter of FIG. 1 can best be understood with reference to the waveforms illustrated in FIGS. 2A through 2E. It should be assumed that the voltage across charge storage means 14 is at zero volts d.c. prior to the initiation of the conversion operation. Control circuit 20 initiates the first integration period of the analog to digital conversion process by generating $N_1$ gating pulses on line 24. In response to these gating pulses, variable charge supply circuit 12 supplies $N_1$ discrete packets of charge to charge storage means 14. The magnitude of each charge packet supplied by variable charge supply 12 is a function of the magnitude of the analog voltage $V_{in}$ and causes the voltage across charge storage means 14 to increase by an amount $\Delta V_1$ which is also proportional to the mangitude of the analog voltage $V_{in}$. See FIG. 2A. After control circuit 20 has caused variable charge supply circuit 12 to apply $N_1$ packets of charge to charge storage means 14, the voltage across charge storage means 14 will have increased from a first value (zero volts d.c. in the embodiment illustrated in FIG. 2) to a second value $V_1 = V_1 \Delta V_1$.

After $N_1$ packets of charge have been transferred to charge storage means 14, control circuit 20 stops supplying gating pulses to line 24 and begins the second integration period by clearing the count in converter 22 (i.e. by applying a clearing pulse to line 30) and by supplying gating pulses to line 26. In response to these gating pulses, charge pumping circuit 16 removes a plurality of discrete packets of charge from charge storage means 14. The charge packets removed by charge pumping circuit 16 each have a substantially constant value and cause the voltage across charge storage means 14 to decrease by a constant amount $\Delta V_2$. Control circuit 20 continues to supply gating pulses to charge pumping circuit 16 until the voltage $V_{csm}$ across charge storage means 14 decreases to its original value (zero volts d.c.). At this time comparator 18 generates an output signal on line 28 informing control circuit 20 to cease supplying gating pulses to charge pumping circuit 16.

As a result of the foregoing operation of analog to digital converter 10, the total charge supplied to charge storage means 14 by variable charge supply circuit 12, is equal to the total charge removed from charge storage means 14 by a charge pumping circuit 16. Stated otherwise:

$$\Delta V_1 N_1 = \Delta V_2 N_2 \tag{1}$$

Since $N_1$ and $\Delta V_2$ are predetermined constants and since $\Delta V_1$ is proportional to the magnitude of the analog voltage $V_{in}$ to the converted, the number of charge packets $N_2$ removed from the charge storage means 14 by charge pumping circuit 16 is representative of the analog voltage $V_{in}$ to be converted. Stated otherwise:

$$N_2 = \frac{\Delta V_1 N_1}{\Delta V_2} = f(V_{in}) \tag{2}$$

Since counter 22 has been counting the number ($N_2$) of gating pulses applied to line 26, the count in counter 22 is a function of the voltage $V_{in}$ to be converted.

An actual application of the analog to digital converter shown in block diagram form in FIG. 1, is illustrated in FIG. 3. In this figure, the counter and control circuit have been omitted. Their cooperation with the elements of FIG. 3 will, however, be described.

In the embodiment illustrated in FIG. 3, the variable charge supply source 12 comprises a bucket brigade circuit of the type well known in the art. Circuits of this type are described in some detail in U.S. application Ser. No. 628,542 filed Nov. 3, 1975 in the names of Walter J. Butler and Charles M. Puckette now abandoned and succeeded by continuation application Ser. No. 853,115, filed Nov. 21, 1977, and both assigned to the assignee of the present invention. Briefly, circuits of this type include a first MOSFET transistor $Q_1$ biased to operate as a switch and a second MOSFET transistor $Q_2$ biased to operate as a "shelf" transistor. During a first clock period, a gating pulse $-V_{g1}$ is applied to the gate of transistor $Q_1$ applying the analog voltage $V_{in}$ across capacitor $C_1$. During the next clock period, a gating pulse $-V_{g2}$ is applied to the gate of transistor $Q_2$ causing charge to transfer from capacitor $C_1$ to capacitor $C_2$ until the voltage across capacitor $C_1$ decreases to a value equal to the gate voltage applied to transistor $Q_2$ less the threshold voltage of the transistor. The net effect of this operation is to increase the voltage across capacitor $C_2$ by an amount:

$$\Delta V_1' = (V_g - V_t \ V_{in})/K \tag{3}$$

wherein $V_g$ is the magnitude of the gating pulse applied to transistor $Q_2$, $V_t$ is the threshold voltage of transistor $Q_2$ and K is the ratio $C_2/C_1$. It should be noted at this point, that the charge transferred from capacitor $C_1$ to capacitor $C_2$ will be either positive or negative depending upon the type of MOSFET transistor utilized. If a p-channel MOSFET is used, positive charge will transferred from capacitor $C_1$ to capacitor $C_2$. If an n-channel MOSFET is used, negative charge will be transferred from capacitor $C_1$ to capacitor $C_2$. In the embodiment illustrated, it is assumed that p-channel MOSFETs are used. It should be understood, however, that the term "charge" as used herein refers to either positive or negative charge depending upon the particular type of device used.

Charge pumping circuit 16 comprises a charge pump circuit of the type described in U.S. Pat. No. 3,819,954. As described in some detail therein, a charge pump transistor will transfer either positive or negative charge from the substrate of the transistor to the charge storage means 14. The polarity of this charge is a function of the type of MOSFET used (n-channel or p-channel) and will have the effect of shifting the voltage across the charge storage means 14 in an opposite direction to the shift caused by the bucket brigade circuit 12. Thus, if p-channel transistors are used in both bucket brigade circuit 12 and in the charge pumping circuit 16, the bucket brigade circuit 12 will cause the voltage across charge storage means 14 to shift in the positive direction while the charge pumping circuit 16 will cause the voltage across charge storage means 14 to shift in the negative direction. If n-channel devices are used instead of p-channel devices, thw opposite relationship is true. In any case, the magnitude of the charge removed from the charge storage means 14 by the charge pumping transistor 16 will be determined by the geometry of the transistor and will be substantially insensitive to temperature changes. Accordingly, charge pumping circuit 16 will cause the voltage across charge storage means 14 to increase (or decrease) by a constant value $\Delta V_2'$ each time a gating signal $V_{g5}$ is applied to the gate of transistor $Q_5$.

The operation of the circuit of FIG. 3 can best be understood with reference to the waveforms of FIG. 4. At the initiation of an analog to digital converting process (at time $t_o$), the gates of transistors $Q_1$, $Q_2$ and $Q_5$ are held at zero volts d.c. and a gating pulse of $-E$ volts is applied to the gate of a precharge transistor $Q_3$. As a result, the voltage at node 36 jumps to $-E + V_t$ volts (see FIG. 4E) wherein $V_t$ is the threshold voltage of transistor $Q_3$ (transistors $Q_1$ through $Q_4$ are preferably identical transistors formed in a single silicon chip). After capacitor $C_2$ has been charged to this value, a series of gating pulses $V_{g5}$ are applied to the gate of transistor $Q_5$ causing transistor $Q_5$ to pump positive charge from capacitor $C_2$. The control circuit continues to supply gating pulses $V_{g5}$ to the gate of transistor $Q_5$ until the voltage at node 36 falls to a value corresponding to the reference voltage $V_{ref}$ applied to the inverting input terminal of comparator 18. The purpose of the above-described operation is to ensure that the voltage across the charge storage means 14 is the same at both the beginning and end of the conversion process. It should be assumed that the reference voltage $V_{ref}$ is set to correspond approximately to the voltage $-E$ at node 36. When this condition is met (at time $t_1$), comparator 18 generates an output pulse $V_o$ (see FIG. 4G) which informs the control circuit to initiate the first integration portion of the dual slope integration process. During this portion the control circuit disables charge pump circuit 16 and precharging circuit 34 (by grounding the gates of transistors $Q_3$ and $Q_5$) and causes bucket brigade circuit 12 to transfer $N_1$ packet of charge to capacitor $C_2$. Since the capacitor $C_2$ is connected to the gate of transistor $Q_2$, the voltage at node 36 varies as a function of both the voltage applied to the gate of transistor $Q_2$ and as a function of the packets of charge applied to capacitors $C_2$ by bucket brigade circuit 12.

The foregoing fluctuation in the value of the voltage at node 36 can best be understood with reference to FIGS. 4B and 4E. At the initiation of the first integration portion the voltage at node 36 is at approximately $-E$ volts. When the leading edge of the first gating pulse $V_{g2}$ is applied to the gate of transistor $Q_2$, the voltage at node 36 instantaneously drops to $-2E$ volts. Thereafter, the positive charge transferred from capacitor $C_1$ to capacitor $C_2$ increases the voltage across capacitor $C_2$ (and therefore the voltage at node 36) by the amount $\Delta V_1'$ in accordance with equation (3), above. When the voltage applied to the gate of transistor $Q_2$ returns to zero volts d.c. (at the trailing edge of the first gating pulse $V_{g2}$) the voltage at node 36 increases by $+E$ volts to $-E + \Delta V_1'$ volts. Accordingly, the net effect of a single charge transfer operation is to increase the voltage across capacitor $C_2$ by an amount $\Delta V_1'$.

The foregoing operation is reiterated $N_1$ times wherein $N_1$ is a predetermined number selected by the control circuit. At the end of $N_1$ iterations of the foregoing process, the voltage across charge storage means 14 increases by a value:

$$N_1 \Delta V_1' = N_1(E - V_{in})/K \qquad (4)$$

It should be noted at this point that the voltage at node 36 alternately rises above and falls below $-E$ volts several times during the first integration portion causing comparator 18 to generate several output pulses $V_o$. To prevent an improper operation of the analog to digital converter circuit, either comparator 18 should be disabled or the control circuit 20 should be made insensitive to the output pulses generated by the comparator 18 during the first integration portion.

At time $t_2$, the first integration portion ends and the second integration portion begins. The control circuit clears the counter, grounds the gates of transistors $Q_1$ and $Q_2$ and begins pumping negative charge into charge storage means 14. As best seen in FIGS. 4C and 4E, the voltage across charge storage means 14 is reduced by a value $\Delta V_2'$ each time a negative gating pulse $V_{g5}$ is applied to the gate of transistor $Q_5$. The control circuit continues applying gating pulses to transistor $Q_5$ every clock period until the charge node 36 returns to $-E$ volts at which time comparator 18 generates another output pulse $V_o$. This pulse informs the control circuit that an analog to digital conversion convertion has been completed.

The total quantity of charge removed from charge storage means 14 by charge pump 16 during the second integration portion is:

$$N_2 \Delta V_2' \qquad (5)$$

As noted above, the total quantity of charge supplied to the charge storage means 14 by bucket brigade circuit 12 during the first integration portion is $N_1 \Delta V_1'/C_2$ (see equation (4) above). Since the comparator 18 causes the control circuit to terminate the second integration period when the voltage at node 36 returns to $-E$ volts, the amount of charge applied to charge storage means 14 by the bucket brigade circuit 12 is equal to the amount of charge removed from charge storage means 14 by charge pump 16. Stated otherwise:

$$N_1 \Delta V_1' = N_2 \Delta V_2' \qquad (6)$$

Substituting equation (4) into equation (6) and solving for $N_2$, we arrive at the following relationship:

$$N_2 = \frac{N_1}{K \Delta V_2'}(E - V_t) - \frac{N_1 V_{in}}{K \Delta V_2'} = f(V_{in}) \qquad (7)$$

Since the counter 22 has been counting the number of gating pulses applied to charge pump 16, the count in the counter provides a digital representation of the magnitude of the analog input signal.

The present invention may be embodied in other specific forms without departing from the spirit or essential attributes thereof and, accordingly, reference should be made to the appended claims, rather than to the foregoing specification as indicating the scope of the invention.

What is claimed is:

1. An analog to digital converter comprising:
    means for storing charge;
    first means for transferring in succession a first plurality of discrete packets of charge to said charge storage means;
    second means for transferring in succession a second plurality of discrete packets of charge from said charge storage means;
    each of said first plurality of discrete packets of charge having a magnitude proportional to the magnitude of an analog signal to be converted, each of said second plurality of discrete packets of charge having a single and essentially constant magnitude;
    control means including a single comparator for causing said first means to supply said first successive plurality of charge packets to said charge storage means during a first portion of a conversion cycle wherein the voltage across said charge storage means changes from a predetermined first value to a second value, said control means also for causing said second means to remove from said charge storage means said second successive plurality of charge packets during a second portion of said conversion cycle wherein the voltage across said charge storage means changes from said second value to said predetermined first value in steps of essentially equal amplitude; and
    means for generating a digital signal which is proportional to the ratio between the number of said first charge packets required to change the voltage across said charge storage means from said first value to said second value and the number of said second charge packets required to change the voltage across said charge storage means from said second value to said first value.

2. The analog to digital converter of claim 1, wherein said first and second means respectively supply and remove charge packets of a first polarity respectively to and from said charge storing means.

3. The analog to digital converter of claim 1, wherein said first means is a bucket brigade circuit.

4. The analog to digital converter of claim 3 wherein said bucket brigade circuit comprises:
    a capacitor;
    a first MOSFET coupled to said capacitor and biased to operate as a switch;
    a second MOSFET coupled to said capacitor and said first MOSFET and biased to operate as a shelf transistor.

5. The analog to digital converter of claim 1 wherein said charge storage means includes a capacitor.

6. The analog to digital converter of claim 1 further including means for precharging said charge storage means to said first value prior to said first portion of said conversion cycle.

7. The analog to digital converter of claim 1 wherein said means for generating a digital signal comprises a digital counter which counts the number of said second succession of charge packets applied to said charge storage means.

8. The analog to digital converter of claim 1 wherein said control means causes said first charge supply means to supply said charge storage means with a predetermined number of charge packets.

9. An analog to digital converter comprising:
    means for storing charge;
    bucket brigade circuit means for supplying in succession a first plurality of discrete packets of charge to said charge storage means, each of said first plurality of charge packets having a first polarity and a magnitude proportional to the magnitude of an analog signal to be converted;
    charge pump means for supplying in succession a second plurality of discrete charge packets to said storage means, each of said second plurality of charge packets having a polarity opposite to that of said second plurality of charge packets and a single and essentially constant magnitude;
    control means for causing said bucket brigade circuit means to supply said charge storage means in succession with a predetermined number of said first plurality of charge packets during a first integration portion wherein the voltage across said charge storage means changes from a first value to a second value, said control means also for causing said charge pump means to supply to said charge storage means said second plurality of discrete charge packets in succession during a second integration portion wherein the voltage across said charge storage means changes from said second value to said first value; and counter means for counting the number of said second plurality of charge packets required to change the voltage across the charge storage means from said second value to said first value during said second portion.

10. The analog to digital converter of claim 9 wherein said bucket brigade circuit means comprises:
    a capacitor;
    a first MOSFET coupled to said capacitor and biased to operate as a switch;
    a second MOSFET coupled to said capacitor and said first MOSFET and biased to operate as a shelf transistor.

11. The analog to digital converter of claim 10 wherein said charge storage means includes a capacitor.

12. The analog to digital converter of claim 11 further including means for precharging said charge storage means to said first value prior to said first integration period.

13. A process for generating a digital signal which is representative of the magnitude of an analog signal, comprising the steps of:
    providing a means for storing charge;
    supplying the charge storage means with a successive first plurality of discrete packets of charge until the voltage across said charge storage means changes from a first value to a second value;
    supplying said charge storage means with a successive second plurality of discrete packets of charge until the voltage across said charge storage means changes from said second value to said first value;
    a first one of said first and second pluralities of packets of charge each having a first polarity and a magnitude proportional to the magnitude of said analog signal, the remaining one of said first and second pluralities of packets of charge each having a second polarity, opposite to said first polarity, and having a single and essentially constant magnitude; and generating a digital signal which is proportional to the ratio of the number of said first plurality of charge packets required to change the voltage across said charge storage means from said first value to said second value and the number of said second plurality of charge packets required to change the voltage across said charge storage means from said second value to said first value.

14. The process of claim 13 wherein each of said first plurality of packets of charge has said first polarity and a magnitude proportional to the magnitude of said analog signal, and each of said second plurality of packets of charge has said second polarity, opposite to the polarity of said first plurality of packets of charge, and said single and essentially constant magnitude.

15. The process of claim 14 wherein said step of supplying said charge storage means with a successive plurality of first packets of charge comprises the steps of supplying said charge storage means with a predetermined number of said plurality of first packets of charge.

16. The process according to claim 15 wherein the step of generating a digital signal includes the step of counting the number of said second plurality of packets of charge which must be applied to said charge storage means to change the voltage across said charge storage means from said second to said first value.

* * * * *